(12) United States Patent
Iyasu et al.

(10) Patent No.: US 12,074,538 B2
(45) Date of Patent: Aug. 27, 2024

(54) POWER CONVERTER PERFORMING SWITCHING CONTROL OF UPPER-ARM AND LOWER-ARM SWITCHES TO CONDUCT CURRENT BETWEEN RECHARGEABLE BATTERIES

(71) Applicant: DENSO CORPORATION, Kariya (JP)

(72) Inventors: Seiji Iyasu, Nisshin (JP); Syusei Nishimura, Nisshin (JP); Atsushi Fukaya, Kariya (JP)

(73) Assignee: DENSO CORPORATION, Kariya (JP)

( * ) Notice: Subject to any disclaimer, the term of this patent is extended or adjusted under 35 U.S.C. 154(b) by 276 days.

(21) Appl. No.: 17/712,540

(22) Filed: Apr. 4, 2022

(65) Prior Publication Data
US 2022/0231619 A1    Jul. 21, 2022

Related U.S. Application Data

(63) Continuation of application No. PCT/JP2020/031038, filed on Aug. 17, 2020.

(30) Foreign Application Priority Data

Oct. 3, 2019 (JP) .................... 2019-183117

(51) Int. Cl.
*H02M 7/5387* (2007.01)
*H02P 27/06* (2006.01)
*H03K 17/082* (2006.01)

(52) U.S. Cl.
CPC ........ *H02M 7/53871* (2013.01); *H02P 27/06* (2013.01); *H03K 17/0822* (2013.01)

(58) Field of Classification Search
CPC ........... H02M 7/53871; H02M 1/0095; H02M 1/0025; H02M 3/1552; H02M 3/1584; H02P 27/06; H03K 17/0822; H02J 7/00; H02J 7/02; H02J 7/48; H02J 7/0014; H02J 7/0063; H02J 2207/20
See application file for complete search history.

(56) References Cited

U.S. PATENT DOCUMENTS

| 2004/0018397 | A1 | 1/2004 | Nagai et al. | |
| 2009/0250279 | A1* | 10/2009 | Holmes | B60L 50/51 180/65.285 |
| 2021/0351684 | A1* | 11/2021 | Nishimura | H02M 3/158 |

FOREIGN PATENT DOCUMENTS

| CN | 114566740 A | * 5/2022 |
| JP | 2013-247690 A | 12/2013 |
| JP | 2015-002605 A | 1/2015 |

* cited by examiner

*Primary Examiner* — Kyle J Moody
*Assistant Examiner* — Jye-June Lee
(74) *Attorney, Agent, or Firm* — Oliff PLC

(57) ABSTRACT

A power converter includes a connection path electrically connecting a negative side of a first rechargeable battery, a positive side of a second rechargeable battery electrically connected in series with the first rechargeable battery, and a neutral point of windings of a rotating electric machine. The power converter further includes a control unit configured to perform switching control of an upper-arm switch and a lower-arm switch for each phase in order to transfer energy between the first and second rechargeable batteries by conducting current between the first and second rechargeable batteries via an inverter, the windings, and the connection path.

16 Claims, 14 Drawing Sheets

<WHEN VEHICLE IS STATIONARY>

⟨WHEN ROTATING ELECTRICAL MACHINE IS BEING DRIVEN⟩

21→22, IM*>0
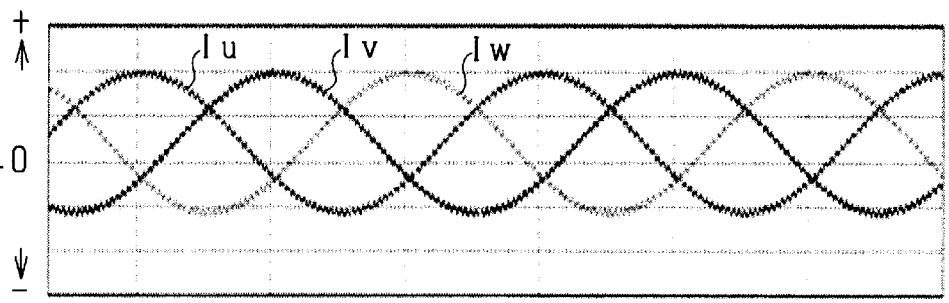
FIG.9A PHASE CURRENT
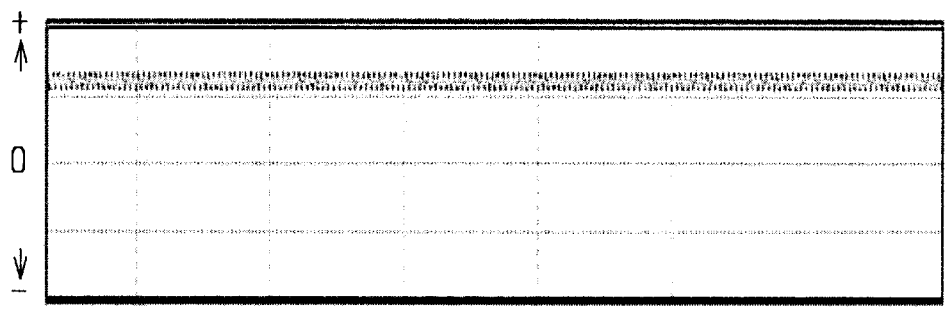
FIG.9B IMr
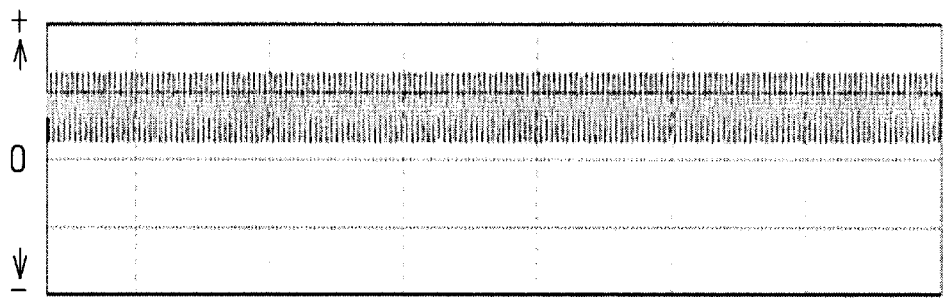
FIG.9C IBH
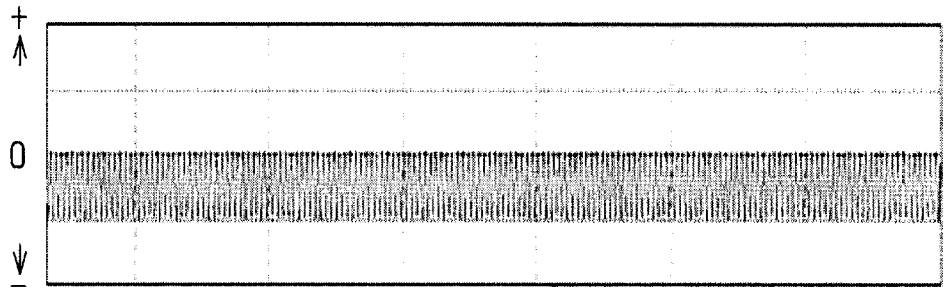
FIG.9D IBL
→ time

22→21, IM✳<0

(a) PHASE CURRENT 0

Iu  Iv  Iw (b) IMr 0

(c) IBH 0

(d) IBL 0

→ time

POWER CONVERTER PERFORMING SWITCHING CONTROL OF UPPER-ARM AND LOWER-ARM SWITCHES TO CONDUCT CURRENT BETWEEN RECHARGEABLE BATTERIES

CROSS-REFERENCE TO RELATED APPLICATION

This application is a continuation application of International Application No. PCT/JP2020/031038 filed Aug. 17, 2020 which designated the U.S. and claims priority to Japanese Patent Application No. 2019-183117 filed with the Japan Patent Office on Oct. 3, 2019, the contents of each of which are incorporated herein by reference.

BACKGROUND

Technical Field

The present disclosure relates to a power converter.

Related Art

Conventionally, a voltage equalization device is known that equalizes terminal voltages between battery cells forming an assembled battery. Specifically, this voltage equalization device includes two switching elements, one for each of two adjacent battery cells, and a reactor. The switching elements and the reactor form a buck-boost converter. This buck-boost converter operates to transfer energy between the battery cells so as to equalize the terminal voltages between the battery cells.

BRIEF DESCRIPTION OF THE DRAWINGS

In the accompanying drawings:

FIGS. 9A-9D are a timing chart illustrating a transition of each phase current or the like during power transfer from the first rechargeable battery to the second rechargeable battery;

DESCRIPTION OF SPECIFIC EMBODIMENTS

The above known voltage equalization device, as described in JP 2013-247690 A, needs dedicated switching elements and the reactor to transfer energy between the battery cells. Thus, there is a concern that the voltage equalization device may increase in size.

In view of the above, it is desired to have a power converter that can be downsized.

One aspect of the present disclosure provides a power converter includes a rotating electric machine including windings, and an inverter including a series connection of an upper arm switch and a lower-arm switch for each phase. The power converter further includes a connection path electrically connecting a negative side of a first rechargeable battery, a positive side of a second rechargeable battery electrically connected in series with the first rechargeable battery, and a neutral point of the windings, and a control unit configured to perform switching control of the upper-arm switch and the lower-arm switch for each phase in order to transfer energy between the first and second rechargeable batteries by conducting current between the first and second rechargeable batteries via the inverter, the windings, and the connection path.

In the present disclosure, the negative side of the first rechargeable battery and the positive side of the second rechargeable battery are electrically connected to the neutral point of the windings by the connection path. Therefore, switching control of the upper and lower arm switches allows current to flow between the first and second rechargeable batteries via the inverter, the windings, and the connection path, which enables energy transfer between the first and second rechargeable batteries.

According to the present disclosure described above, energy can be transferred between the first and second rechargeable batteries by sharing the windings and inverter of the rotating electric machine. This makes it possible to reduce the size of the power converter.

First Embodiment

A power converter according to a first embodiment of the present disclosure will now be described with reference to the accompanying drawings. The power converter of the present embodiment is mounted to, for example, an electric vehicle (EV) or a hybrid vehicle (HV).

Figure 1:
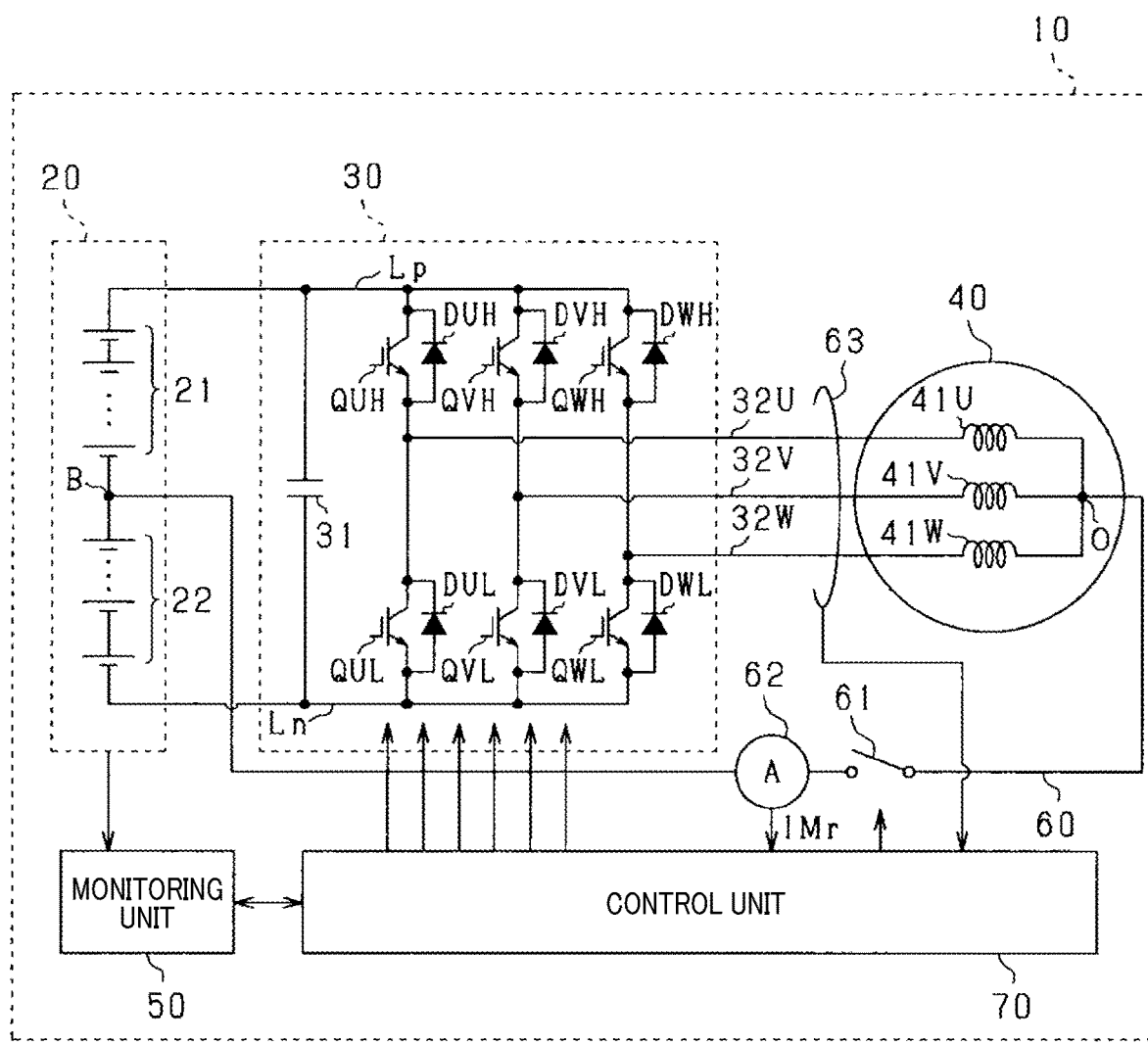
FIG. 1 is schematic diagram of a power converter according to a first embodiment.

As illustrated in FIG. 1, the power converter 10 includes an inverter 30 and a rotating electrical machine 40. The rotating electrical machine 40 is a three-phase synchronous machine having U-, V-, and W-phase windings 41U, 41V, 41W star-connected as stator windings. The U-, V-, and W-phase windings 41U, 41V, 41W are 120 degrees in electrical angle out of phase. The rotating electrical machine 40 is, for example, a permanent magnet synchronous machine. In the present embodiment, the rotating electrical machine 40 is a vehicle-mounted prime mover that serves as a driving power source of the vehicle.

The inverter 30 includes a series connection of an upper-arm switch QUH and a lower-arm switch QUL of the U-phase, an upper-arm switch QVH and a lower-arm switch QVL of the V-phase, and an upper-arm switch QWH and a lower-arm switch QWL of the W-phase. In the present embodiment, each of the switches QUH, QVH, QWH, QUL, QVL, and QWL is a voltage-controlled semiconductor switching element, such as an insulated gate bipolar transistor (IGBT). Therefore, the high-side terminal of each of the switches QUH, QVH, QWH, QUL, QVL, and QWL is the collector. The low-side terminal of each of the switches QUH, QVH, QWH, QUL, QVL, and QWL is the emitter. Each of the switches QUH, QVH, QWH, QUL, QVL, and QWL is provided with a freewheel diode connected in anti-parallel.

The emitter of the U-phase upper-arm switch QUH and the collector of the U-phase lower-arm switch QUL are connected to a first end of the U-phase winding 41U through a U-phase conductive member 32U, such as a bus bar. The emitter of the V-phase upper-arm switch QVH and the collector of the V-phase lower-arm switch QVL are connected to a first end of the V-phase winding 41V through a V-phase conductive member 32V, such as a bus bar. The emitter of the W-phase upper-arm switch QWH and the collector of the W-phase lower-arm switch QWL are connected to a first end of the W-phase winding 41W through a W-phase conductive member 32W, such as a bus bar. Second ends of the U-, V-, and W-phase windings 41U, 41V, 41W are connected to each other at a neutral point O. This means that the phase windings 41U, 41V, 41W are configured to have the same inductance.

The collector of each of the upper-arm switches QUH, QVH, and QWH is connected to the positive terminal of the assembled battery 20 by a positive bus Lp such as a bus bar. The emitter of each of the lower-arm switches QUL, QVL, QWL is connected to the negative terminal of the assembled battery 20 by a negative bus Lp such as a bus bar.

The power converter 10 includes a capacitor 31 that connects the positive bus Lp and the negative bus Ln. The capacitor 31 may be included in the inverter 30 or provided outside the inverter 30.

The assembled battery 20 is configured as a series connection of battery cells as a single battery, with a terminal voltage of several hundred volts, for example. In the present embodiment, the terminal voltages (e.g., rated voltage) of respective ones of the battery cells forming the assembled battery 20 are set to the same as each other. For example, each battery cell may be a secondary battery, such as a lithium-ion battery. The assembled battery 20 may be provided outside the power converter 10.

In the present embodiment, among the battery cells forming the assembled battery 20, a series connection of a plurality of battery cells on the high side forms a first rechargeable battery 21, and a series connection of a plurality of battery cells on the low side forms a second rechargeable battery 22. That is, the assembled battery 20 is divided into two blocks. In the present embodiment, the number of battery cells forming the first rechargeable battery 21 and the number of battery cells forming the second rechargeable battery 22 are equal to each other. Therefore, the terminal voltage (e.g., rated voltage) of the first rechargeable battery 21 and the terminal voltage (e.g., rated voltage) of the second rechargeable battery 22 are equal to each other.

In the assembled battery 20, the negative terminal of the first rechargeable battery 21 and the positive terminal of the second rechargeable battery 22 are connected to an intermediate terminal B.

The power converter 10 includes a monitoring unit 50. The monitoring unit 50 monitors the terminal voltage, the state of charge (SOC), the state of health (SOH), the temperature, and the like, of each of the battery cells forming the assembled battery.

The power converter 10 includes a connection path 60 and a connection switch 61. The connection path 60 electrically connects the intermediate terminal B of the assembled battery 20 to the neutral point O. The connection switch 61 is provided on the connection path 60. In the present embodiment, a relay is used as the connection switch 61. When the connection switch 61 is turned on, the intermediate terminal B and the neutral point O are electrically connected. When the connection switch 61 is turned off, the intermediate terminal B and the neutral point O are electrically disconnected.

The power converter 10 includes a current sensor 62 and a phase current sensor 63. The current sensor 62 detects a current flowing through the connection path 60. The phase current sensor 63 detects at least two of the three phase currents. The phase current sensor 63 detects, for example, currents flowing through at least two of the conducting members 32U-32W. Detected values from each current sensor 62, 63 are transmitted to the control unit 70 (corresponding to a control unit) included in the power converter 10.

The control unit 70 is mainly configured as a microcomputer and performs switching control for controlling switching of the switching elements forming the inverter 3 to feedback-control a controlled variable to its command value. The controlled variable is, for example, torque. In each phase, the upper-arm switch and the lower-arm switch are turned on alternately.

The control unit 70 turns on and off the connection switch 61 and is communicable with the monitoring unit 50. The control unit 70 performs various control functions by executing programs stored in a storage device provided in the control unit 70. The various control functions may be implemented by electronic circuits as hardware, or by both hardware and software.

Figure 2:
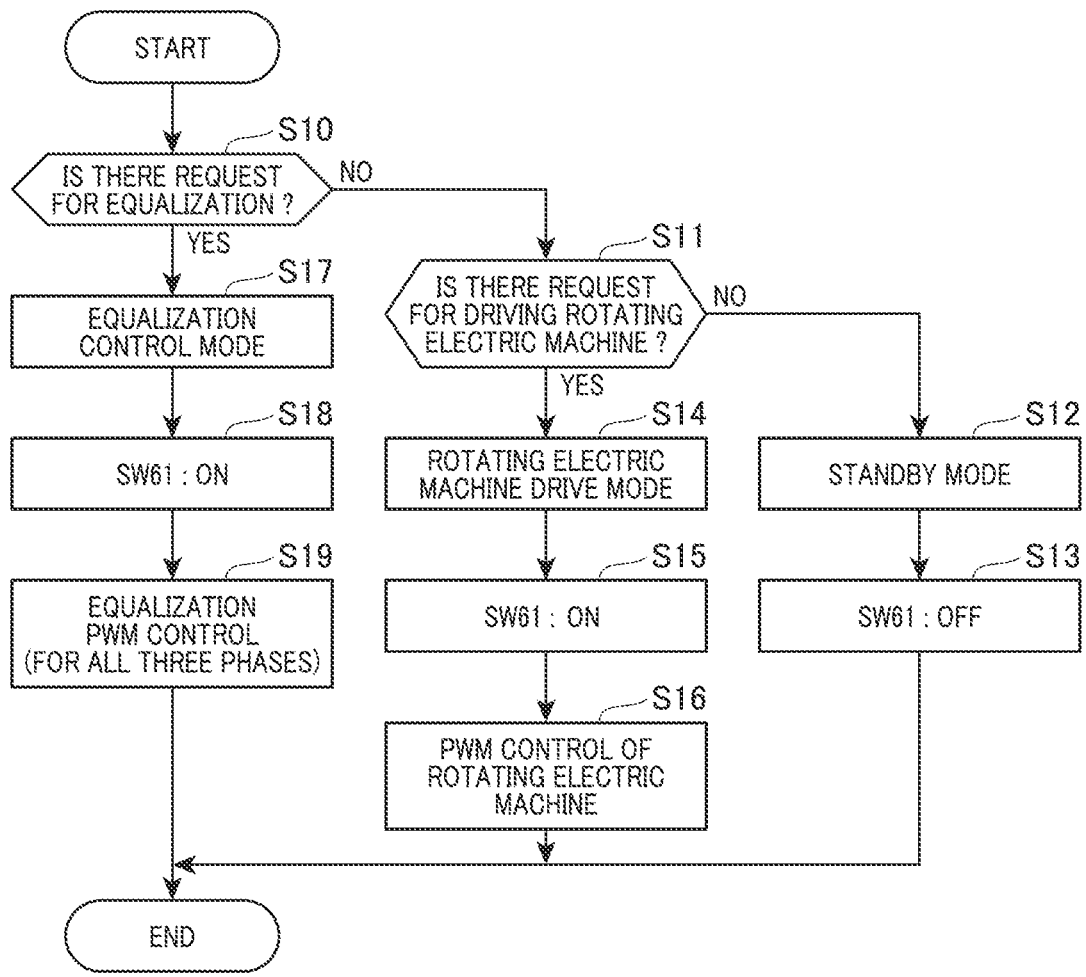
FIG. 2 is a flowchart of process steps performed by a control unit.

Equalization control performed by the control unit 70 will now be described. FIG. 2 is a flowchart illustrating process steps of an equalization control process. This equalization control process is repeatedly performed by the control unit 70, for example, every predefined control cycle.

At step S10, the control unit 70 determines whether there is an equalization request for equalizing the terminal voltages of the first rechargeable battery 21 and the second rechargeable battery 22. In the present embodiment, if the control unit 70 determines that an absolute value of a difference between the terminal voltage VBH of the first rechargeable battery 21 and the terminal voltage VBL of the second rechargeable battery 22 exceeds a predefined value ΔV, the control unit 70 determines that there is the equalization request for equalizing the terminal voltages of the first rechargeable battery 21 and the second rechargeable battery 22. The terminal voltage VBH of the first rechargeable battery 21 and the terminal voltage VBL of the second rechargeable battery 22 may be acquired from the monitoring unit 50.

If at step S10 the control unit 70 determines that there is no equalization request, the process flow proceeds to step S11, where the control unit 70 determines whether there is a drive request for driving the rotating electric machine 40. In the present embodiment, this drive request includes a request for driving the vehicle by rotationally driving the rotating electrical machine 40.

If at step S11 the control unit 70 determines that there is no drive request, the process flow proceeds to step S12. At step S12, the control unit 70 sets the operating mode of the rotating electrical machine 40 to a standby mode. Setting the operating mode to the standby mode allows each of the switches of the inverter 30, QUH to QWL, to be turned off. Then, at step S13, the control unit 70 turns off the connection switch 61. This electrically disconnects the intermediate terminal B from the neutral point O.

If at step S11 the control unit 70 determines that there is the drive request, the process flow proceeds to step S14. At step S14, the control unit 70 sets the operating mode of the rotating electric machine to a drive mode. Then, at step S15, the control unit 70 turns on the connection switch 61. This electrically connects the intermediate terminal B and the neutral point O via the connection path 60. Then, at step S16, the control unit 70 performs switching control of each of the switches of the inverter 30, QUH to QWL, to rotationally drive the rotating electrical machine 40. This causes drive wheels of the vehicle to rotate, thereby enabling movement of the vehicle.

If at step S10 the control unit 70 determines that there is the equalization request, the process flow proceeds to step S17. At step S17, the control unit 70 sets the operating mode of the rotating electric machine to an equalization control mode. Then, at step S18, the control unit 70 turns on the connection switch 61.

At step S19, the control unit 70 performs the equalization control to equalize the terminal voltages of the first rechargeable battery 21 and the second rechargeable battery 22. This equalization control will now be described.

Figure 3A:
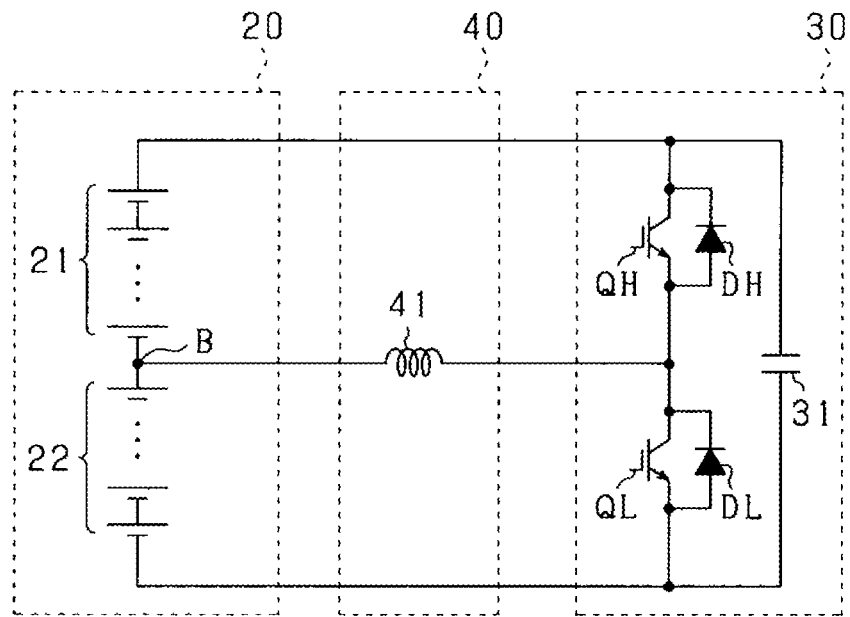
FIGS. 3A-3B are schematic diagrams of an equivalent circuit.

FIG. 3A illustrates an equivalent circuit of the power converter 10 used in equalization control. In FIG. 3A, each of the phase windings 41U-41W is denoted as a winding 41, each of the upper-arm switches QUH, QVH, and QWH is denoted as an upper-arm switch QH, and each of the upper-arm diodes DUH, DVH, and DWH is denoted as an upper-arm diode DH. Each of the lower-arm switches QUL, QVL, and QWL is denoted as a lower-arm switch QL, and each of the lower-arm diodes DUL, DVL, and DWL is denoted as a lower-arm diode DL.

Figure 3B:
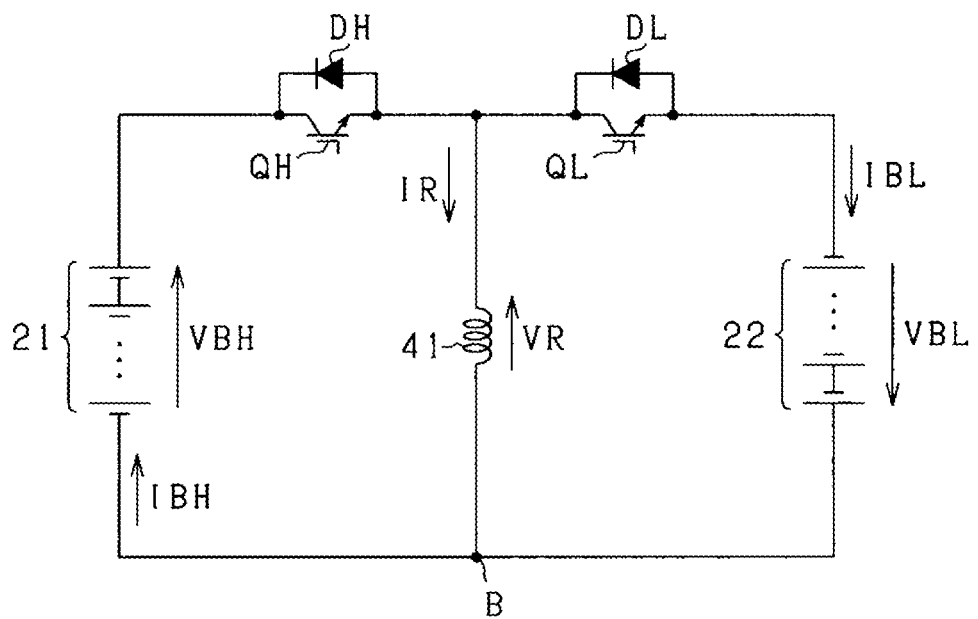

The equivalent circuit in FIG. 3A may be illustrated as an equivalent circuit in FIG. 3B. The circuit in FIG. 3B is a buck-boost chopper circuit that can bidirectionally transfer power between the first and second rechargeable batteries 21 and 22. In FIG. 3B, IBH represents current flowing through the first rechargeable battery 21, and IBL represents current flowing through the second rechargeable battery 22. When charging current flows through each of the first and second rechargeable batteries 21, 22, IBH and IBL take a negative value. When discharging current flows through each of the first and second rechargeable batteries 21, 22, IBH and IBL take a positive value. VR represents a terminal voltage across the winding 41, and IR represents current flowing through the neutral point O. When current flows through the neutral point O in a positive direction from the winding 41 to the intermediate terminal B, IR takes a negative value. When current flows through the neutral point O in a negative direction from the intermediate terminal B to the winding 41, IR takes a positive value.

Referring to FIG. 3B, when the upper-arm switch QH is turned on, the terminal voltage VR of the winding 41 becomes "VBH". When the lower-arm switch QL is turned on, the terminal voltage VR of the winding 41 becomes "VBL". That is, turning on the upper-arm switch QH can cause a positive excitation current to flow through the winding 41. Turning on the lower-arm switch QL can cause a negative excitation current to flow through the winding 41.

Figure 4:
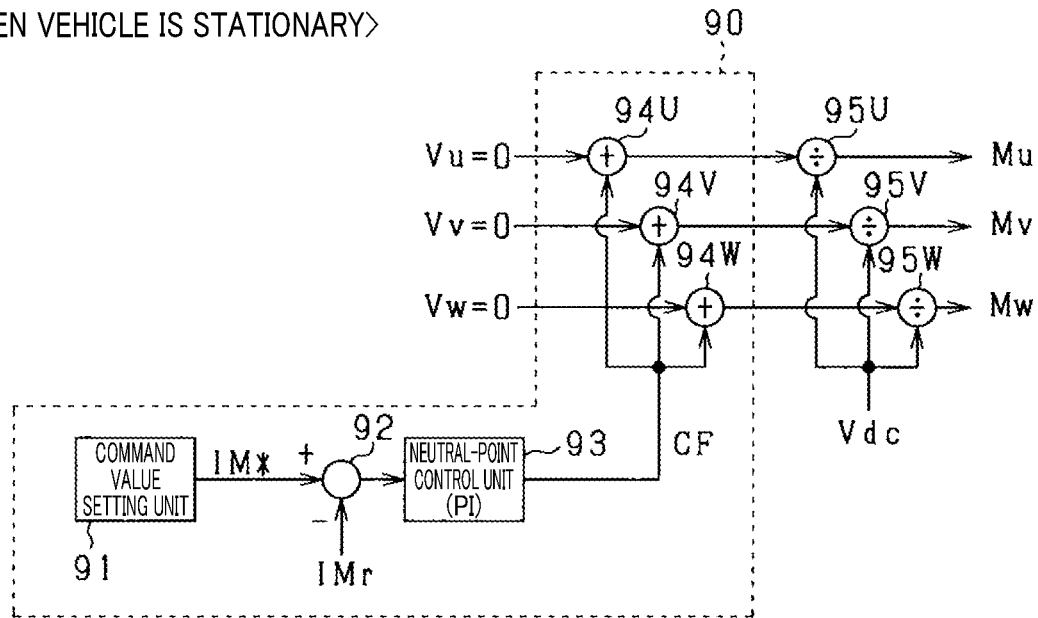
FIG. 4 is a block diagram illustrating a process performed by the control unit when a vehicle is stationary.

FIG. 4 illustrates a block diagram of equalization control. FIG. 4 is a control block of equalization control that is performed while the vehicle is stationary before the rotating electrical machine 40 is driven.

The control unit 70 includes an equalization control unit 90. The equalization control unit 90 includes a command value setting unit 91, a neutral-point deviation calculation unit 92, a neutral-point control unit 93, and U-, V- and W-phase superposition units 94U to 94W.

Figure 5:
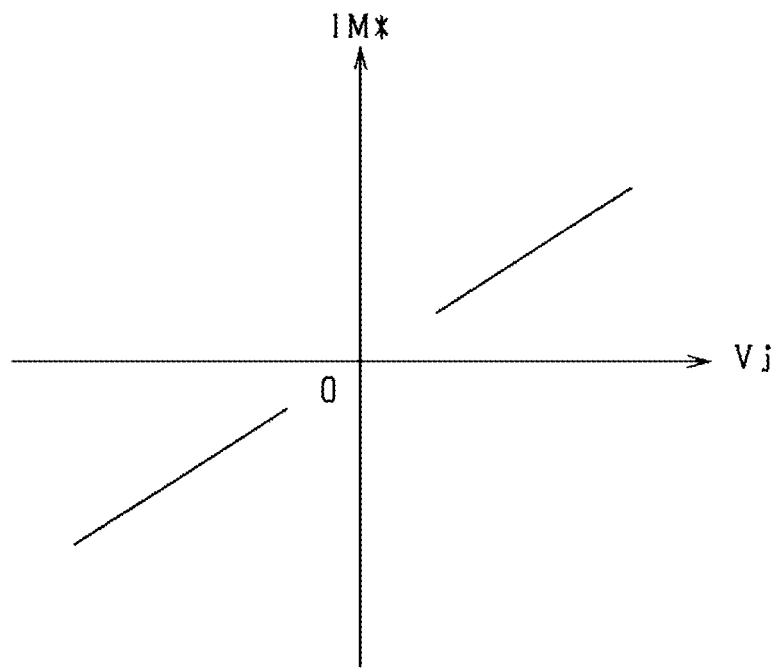
FIG. 5 is an illustration of a method of setting a command current.

The command value setting unit 91 sets a neutral-point command current IM*. Specifically, the command value setting unit 91 subtracts the terminal voltage VBL of the second rechargeable battery 22 from the terminal voltage VBH of the first rechargeable battery 21 to thereby calculate a judgment voltage Vj (=VBH−VBL). If the calculated judgment voltage Vj is positive, the command value setting unit 91 sets the neutral-point command current IM* to a positive value. Specifically, as illustrated in FIG. 5, the higher the judgment voltage Vj is, the larger the neutral-point command current IM* is set.

If the calculated judgment voltage Vj is negative, the command value setting unit 91 sets the neutral-point command current IM* to a negative value. Specifically, as illustrated in FIG. 5, the larger the absolute value of the judgment voltage Vj, the larger the absolute value of the neutral-point command current IM* is set.

The neutral-point deviation calculation unit 92 subtracts a neutral-point current IMr that is a current detected by the current sensor 62 from the neutral-point command current IM* to thereby calculate a neutral-point current deviation ΔIM. In the present embodiment, the neutral-point command current IM* is a direct-current (DC) signal.

The neutral-point control unit 93 calculates an offset correction amount CF as a manipulated variable for feedback-controlling the calculated neutral-point current deviation ΔIM to zero. In the present embodiment, proportional-integral control is used for this feedback control. The feedback control is not limited to proportional-integral control, but may be, for example, proportional-integral-derivative control.

The U-phase superposition unit 94U adds the offset correction amount CF to a U-phase command voltage Vu to calculate a U-phase final command voltage "Vu+CF". The V-phase superposition unit 94V adds the offset correction amount CF to a V-phase command voltage Vv to calculate a V-phase final command voltage "Vv+CF". The W-phase superposition unit 94W adds the offset correction amount CF to a W-phase command voltage Vw to calculate a W-phase final command voltage "Vw+CF". In the process illustrated in FIG. 4, as the vehicle is stationary, each of the U-, V-, and W-phase command voltages Vu, Vv, and Vw is zero. Therefore, each of the U-, V-, and W-phase final command voltages is the offset correction amount CF.

The control unit 70 includes a U-, V-, and W-phase modulation units 95U, 95V, 95W. The U-phase modulation unit 95U divides the U-phase final command voltage by a power-source voltage Vdc to calculate a U-phase modulation ratio Mu. The power-source voltage Vdc is a sum of the terminal voltage VBH of the first rechargeable battery 21 and the terminal voltage VBL of the second rechargeable battery 22 acquired from the monitoring unit 50. The V-phase modulation unit 95V divides the V-phase final command voltage by the power-source voltage Vdc to calculate a V-phase modulation ratio Mv. The W-phase modulation unit 95W divides the W-phase final command voltage by the power-source voltage Vdc to calculate a W-phase modulation ratio Mw.

Based on each of the calculated modulation ratios Mu, Mv, and Mw, the control unit 70 performs switching control of the U-, V-, and W-phase switches QUH to QWL. Specifically, for example, the control unit 70 may perform switching control of the U-, V-, and W-phase switches QUH to QWL by PWM control based on comparison in magnitude between a carrier signal (e.g., triangular wave signals) and each of the modulation ratios Mu, Mv, and Mw.

Figure 6:
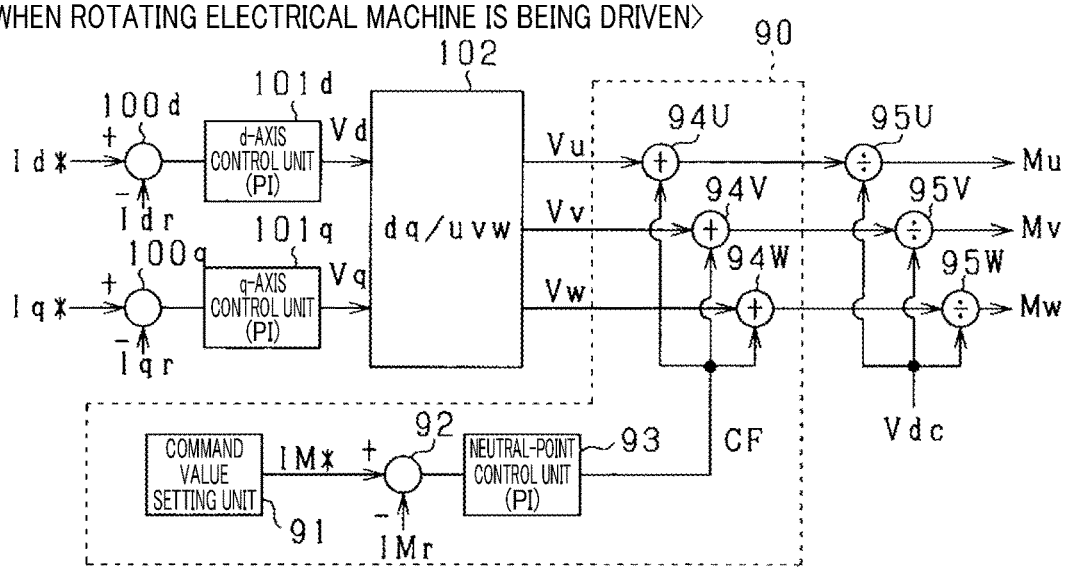
FIG. 6 is a block diagram illustrating a process performed by the control unit when the rotating electric machine is being driven.

Equalization control can be performed not only when the vehicle is stationary, but also when the vehicle is moving by driving the rotating electrical machine 40. FIG. 6 illustrates a control block of equalization control performed when the vehicle is moving by driving the rotating electrical machine 40. For illustration purposes, in FIG. 6, the same structural elements as in FIG. 4 share the same reference numerals.

In the control unit 70, a d-axis deviation calculation unit 100d subtracts a d-axis current Idr from a d-axis command current Id* to calculate a d-axis current deviation Δ. A q-axis deviation calculation unit 100q subtracts a q-axis current Iqr from a q-axis command current Iq* to calculate a q-axis current deviation Δ. The d-axis command current Id* and the q-axis command current Iq* are set based on a command torque for the rotating electrical machine 40. The d-axis current Idr and the q-axis current Iqr are set based on detected values from the phase current sensor 63 and electrical angles of the rotating electrical machine 40. The electrical angle may be a detected value from a rotation angle sensor such as a resolver, or may be an estimated value estimated in position sensorless control.

A d-axis control unit 101d calculates a d-axis voltage Vd as a manipulated variable to feedback-control the calculated d-axis current deviation ΔId to zero. A q-axis control unit 101q calculates a q-axis voltage Vq as a manipulated variable to feedback-control the calculated q-axis current deviation ΔIq to zero. In the present embodiment, proportional-integral control is used as the feedback control of each of the control units 101d, 101q. The feedback control is not limited to proportional-integral control, but may be, for example, proportional-integral-derivative control.

A three-phase conversion unit 102 calculates U-, V-, and W-phase command voltages Vu to Vw in the 3-phase fixed coordinate system based on the d-axis voltage Vd, the q-axis voltage Vq, and the above electrical angles. The respective phase command voltages Vu to Vw are signals (specifically, sinusoidal signals) shifted in phase from each other by an electrical angle of 120 degrees.

U-, V- and W-phase superposition units 94U to 94W adds the offset correction amount CF to the U-, V- and W-phase command voltages calculated by the three-phase conversion unit 102. The U-, V-, and W-phase final command voltages are thereby calculated.

Figure 7:
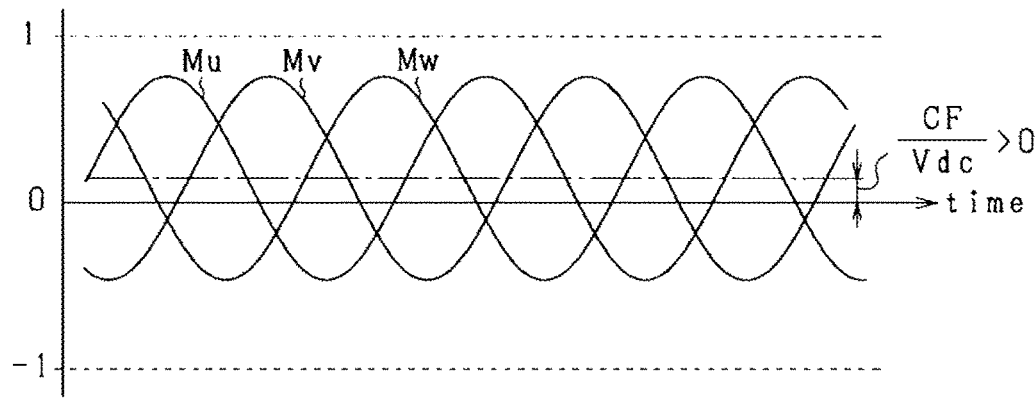
FIG. 7 is a timing chart illustrating a transition of each modulation rate during power transfer from a first rechargeable battery to a second rechargeable battery.

FIG. 7 illustrates a transition of each of the phase modulation rates Mu to Mw in a case where the neutral-point command current IM* is positive. In this case, current is supplied from the first rechargeable battery 21 to the second rechargeable battery 22, and the terminal voltages of the respective rechargeable batteries 21, 22 are equalized.

Figure 8:
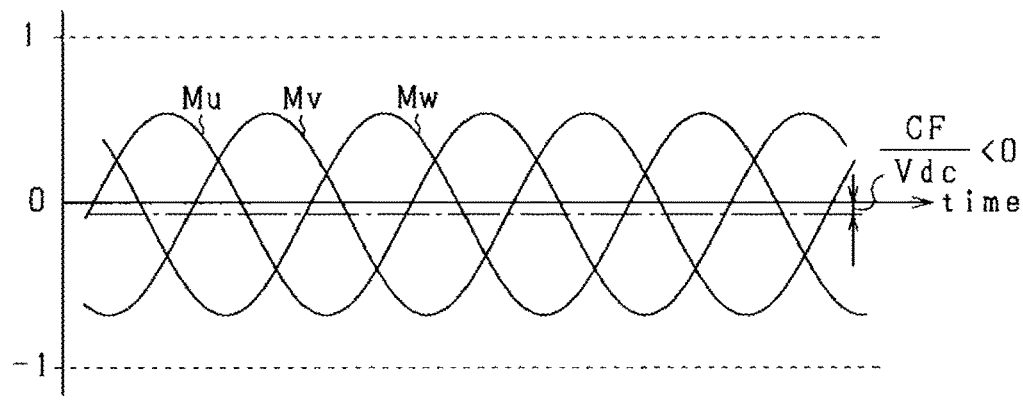
FIG. 8 is a timing chart illustrating a transition of each modulation rate during power transfer from the second rechargeable battery to the first rechargeable battery.

FIG. 8 illustrates a transition of each of the phase modulation rates Mu to Mw in a case where the neutral-point command current IM* is negative. In this case, current is supplied from the second rechargeable battery 22 to the first rechargeable battery 21, and the terminal voltages of the respective rechargeable batteries 21, 22 are equalized.

Figure 10A:
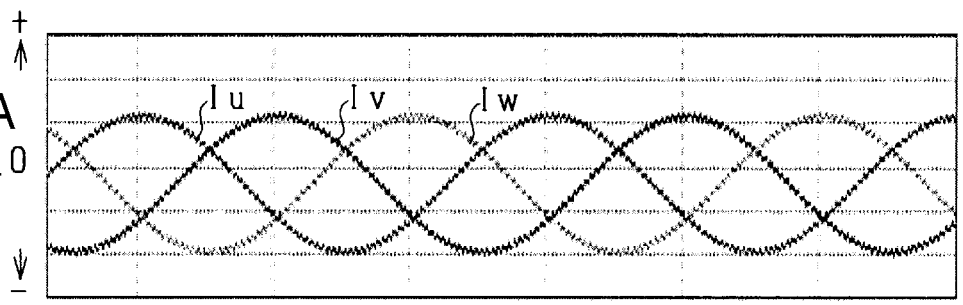
FIGS. 10A-10D are a timing chart illustrating a transition of each phase current or the like during power transfer from the second rechargeable battery to the first rechargeable battery.
Figure 10B:
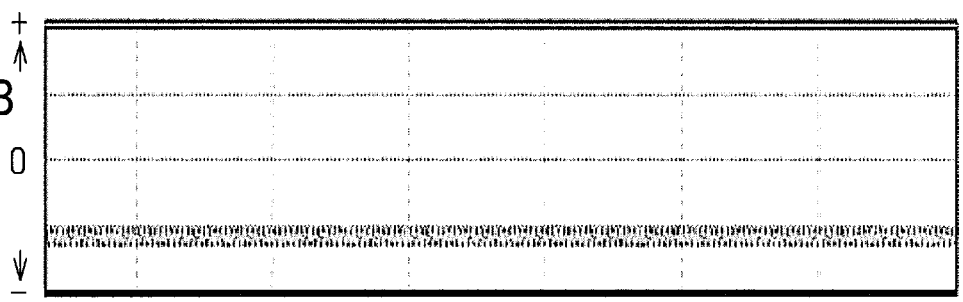
Figure 10C:
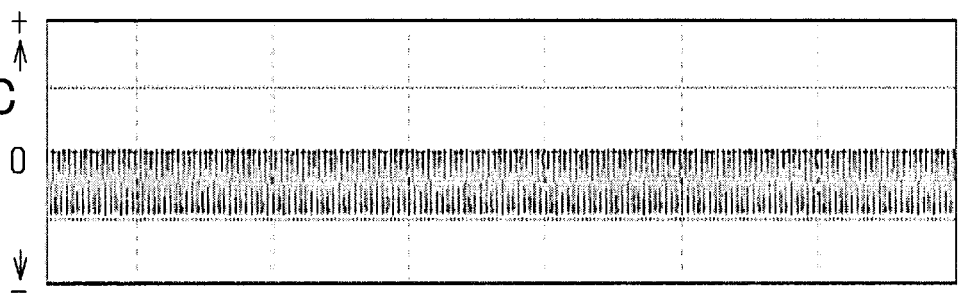
Figure 10D:
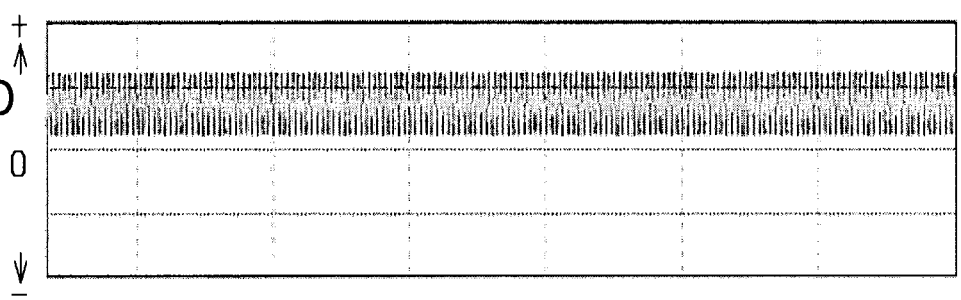

FIG. 9 illustrates each waveform in a case where the neutral-point command current IM* is set to a positive value. FIG. 9A illustrates a transition of each of the phase currents Iu, Iv, and Iw. FIG. 9B illustrates a transition of the neutral-point current IMr. FIG. 9C illustrates a transition of the current IBH flowing through the first rechargeable battery 21. FIG. 9D illustrates a transition of the current IBL flowing through the second rechargeable battery 22. FIG. 10 illustrates each waveform in a case where the neutral-point command current IM* is set to a negative value. FIGS. 10A-10D correspond to FIGS. 9A-9D, respectively. As illustrated in FIGS. 9B and 10B, DC current flows through the connection path 60.

The present embodiment described in detail above can provide the following advantages.

The intermediate terminal B and the neutral point O are electrically connected by the connection path 60. Therefore, when it is determined that there is the equalization request, switching control of the switches QUH to QWL is performed to conduct electrical current between the first rechargeable battery 21 and the second rechargeable battery 22 via the inverter 30, the windings 41U-41W and the connection path 60, which enables equalization of the terminal voltages of the first and second rechargeable batteries 21 and 22. This allows the terminal voltages of the first and second rechargeable batteries 21 and 22 to be equalized using the existing windings 41U-41W and inverter 30. Therefore, there is no need to add a dedicated reactor for equalization, which allows the power converter 10 to be downsized.

When it is determined that there is the equalization request, the connection switch 61 provided along the connection path 60 is turned on. When it is determined that there is no equalization request, the connection switch 61 is turned off. This can inhibit current from flowing between the neutral point O and the intermediate terminal B when there is no equalization request.

When it is determined that there is the equalization request while the rotating electrical machine 40 is being driven, switching control of each of the switches QUH to QWL is performed to equalize the terminal voltages of the first rechargeable battery 21 and the second rechargeable battery 22 while driving the rotating electrical machine 40. This allows both drive control of the rotating electrical machine 40 and equalization control to be performed.

In equalization control, switching control of the U-, V-, and W-phase upper-arm switches QUH, QVH, and QWH is synchronized, and switching control of the U-, V-, and W-phase lower-arm switches QUL, QVL, and QWL is synchronized. This allows the phase windings 41U, 41V, 41W to be regarded as an equivalent circuit in which the windings are connected in parallel. Therefore, the inductance of the windings during equalization control can be reduced. This can increase an amount of change in current flowing through the neutral point in one switching cycle of each of the switches QUH to QWL, which allows equalization control to be performed with a large current, for example, when the vehicle is stationary.

Second Embodiment

Figure 11:
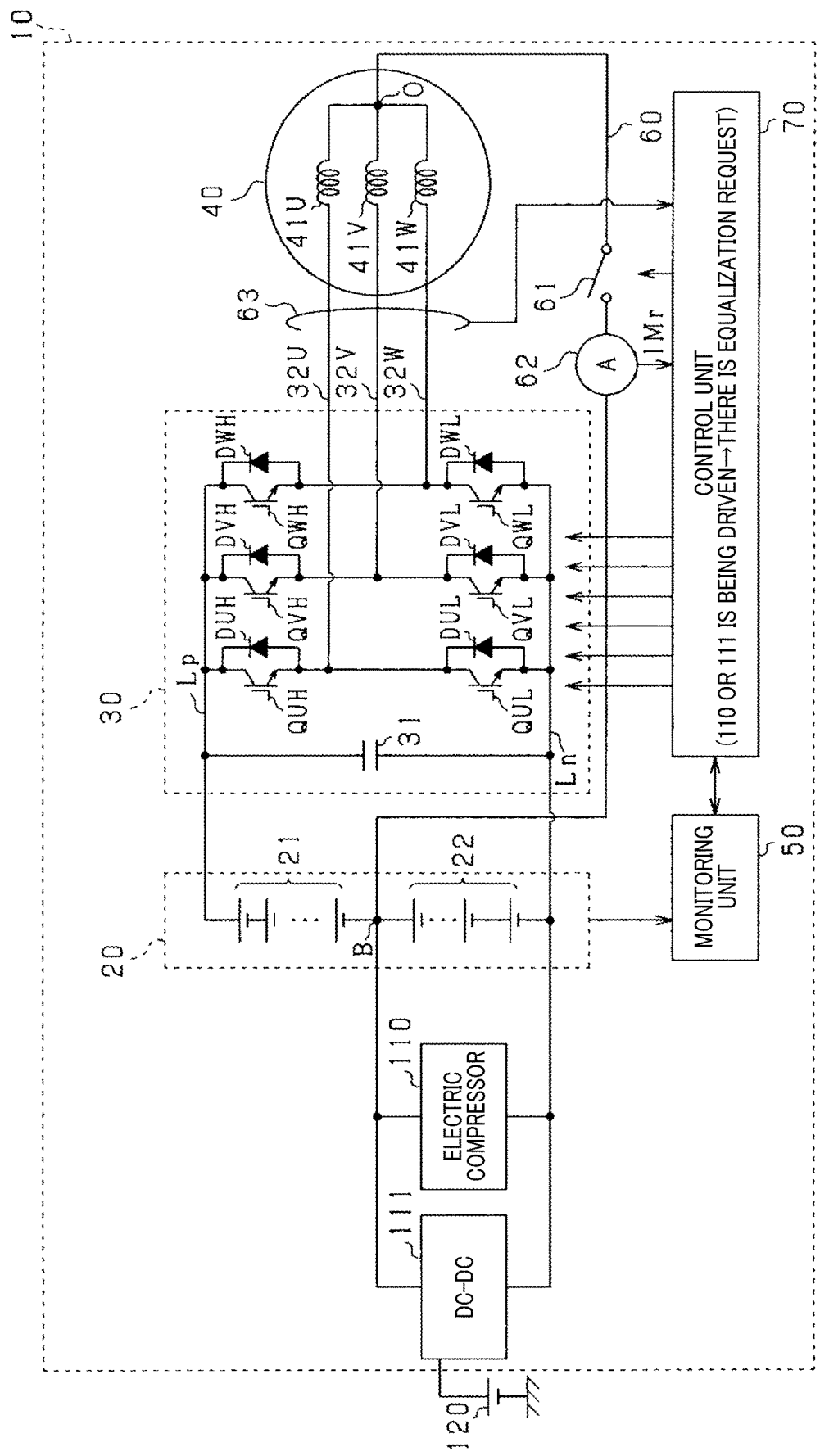
FIG. 11 is a schematic diagram of a power converter according to a second embodiment.

A second embodiment will now be described with reference to the accompanying drawings, focusing on differences from the first embodiment. In the present embodiment, as illustrated in FIG. 11, the second rechargeable battery 22 is connected in parallel with an electric compressor 110 and a DC-DC converter 111. For illustration purposes, in FIG. 11, the same structural elements as in FIG. 1 share the same reference numerals.

The electric compressor 110 is provided for cabin air conditioning and is driven to circulate refrigerant in the refrigeration cycle. The DC-DC converter 111 is driven to buck or step down the output voltage of the second rechargeable battery 22 and supply it to a low-voltage rechargeable battery 120. The low-voltage rechargeable battery 120 is, for example, a lead-acid battery with a rated voltage of 12 V.

In the present embodiment, in response to the control unit 70 determining that at least one of the electric compressor 110 and the DC-DC converter 111 is being driven, the control unit 70 determines that there is the equalization request. In response to determining that there is the equalization request, the control unit 70 performs switching control of the respective switches QUH to QWL to conduct current from the first rechargeable battery 21 to the second rechargeable battery 22 via the inverter 30 and the connection path 60, thereby equalizing the terminal voltages of the first and second rechargeable batteries 21 and 22.

According to the above described embodiment, even in cases where electric power is taken out of the second rechargeable battery 22 by driving at least one of the electric compressor 110 and the DC-DC converter 111, it is possible to suppress significant variations in the state of charge (SOC) of each of the rechargeable batteries 21 and 22.

Third Embodiment

Figure 12:
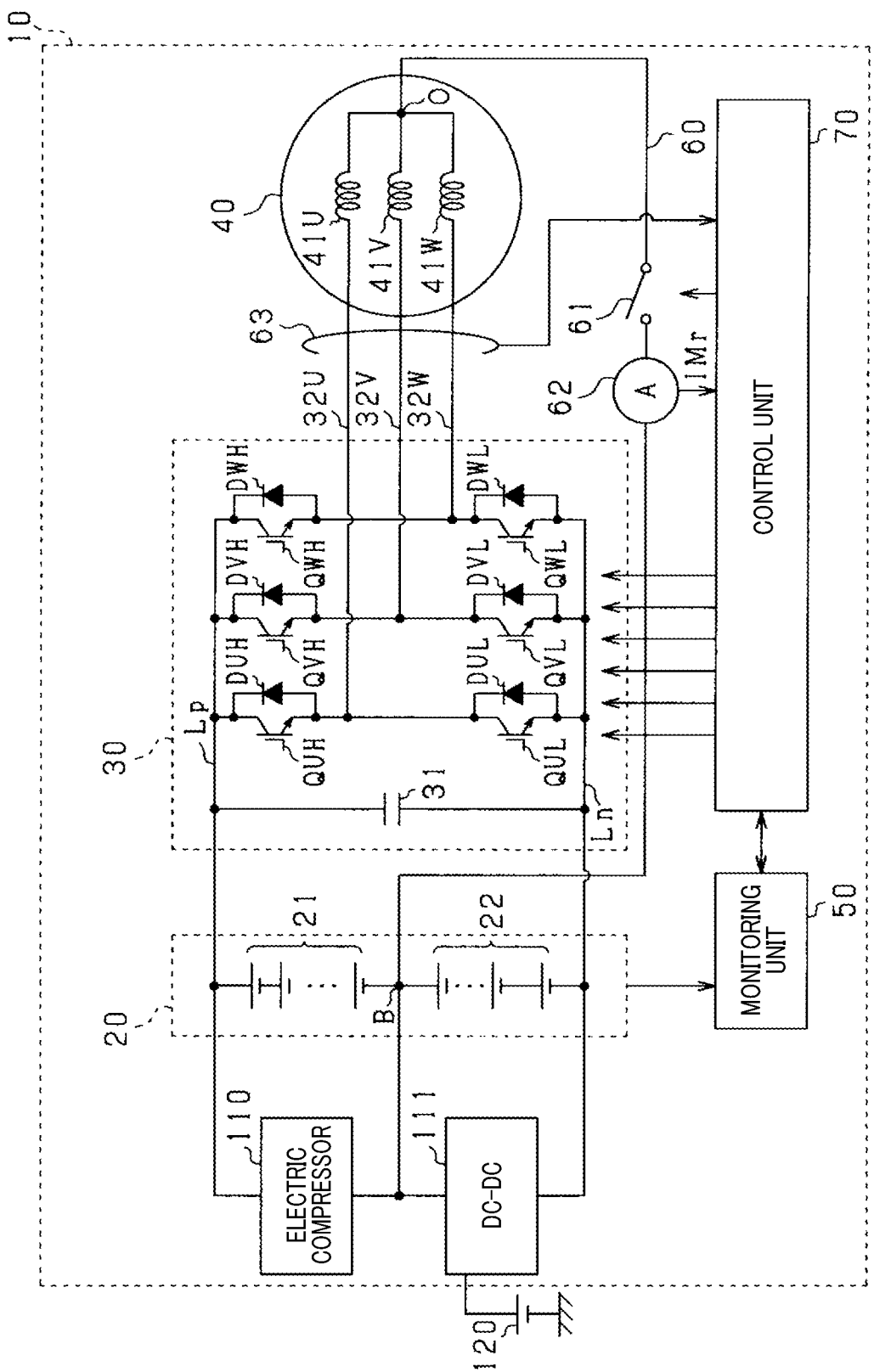
FIG. 12 is a schematic diagram of a power converter according to a third embodiment.

A third embodiment will now be described with reference to the accompanying drawings, focusing on differences from the second embodiment. In the present embodiment, as illustrated in FIG. 12, the first rechargeable battery 21 is connected in parallel with the electric compressor 110, and the second rechargeable battery 22 is connected in parallel with the DC-DC converter 111. For illustration purposes, in FIG. 12, the same structural elements as in FIG. 11 share the same reference numerals.

In response to the control unit 70 determining that at least one of the electric compressor 110 and the DC-DC converter 111 is being driven, the control unit 70 determines that there is the equalization request. In response to determining that there is the equalization request, the control unit 70 performs switching control of the respective switches QUH to QWL to conduct current between the first rechargeable battery 21 and the second rechargeable battery 22 via the inverter 30 and the connection path 60 to equalize the terminal voltages of the first and second rechargeable batteries 21 and 22.

For example, in response to the control unit 70 determining that electric power taken out of the first rechargeable battery 21 by driving the electric compressor 110 is greater than electric power taken out of the second rechargeable battery 22 by driving the DC-DC converter 111, the control unit 70 performs switching control of the respective switches QUH to QWL to conduct current from the second rechargeable battery 22 to the first rechargeable battery 21 via the inverter 30 and the connection path 60. In response to the control unit 70 determining that electric power taken out of the second rechargeable battery 22 by driving the DC-DC converter 111 is greater than electric power taken out of the first rechargeable battery 21 by driving the electric compressor 110, the control unit 70 performs switching control of the respective switches QUH to QWL to conduct current from the first rechargeable battery 21 to the second rechargeable battery 22 via the inverter 30 and the connection path 60.

According to the above described embodiment, even in cases where electric power taken by the electric compressor 110 and the DC-DC converter 111 respectively out of the rechargeable batteries 21 and 22, the drive timings or the operation rates of the electric compressor 110 and the DC-DC converter 111 are significantly different, it is possible to suppress significant variations in the state of charge (SOC) of each of the rechargeable batteries 21 and 22.

Fourth Embodiment

Figure 13:
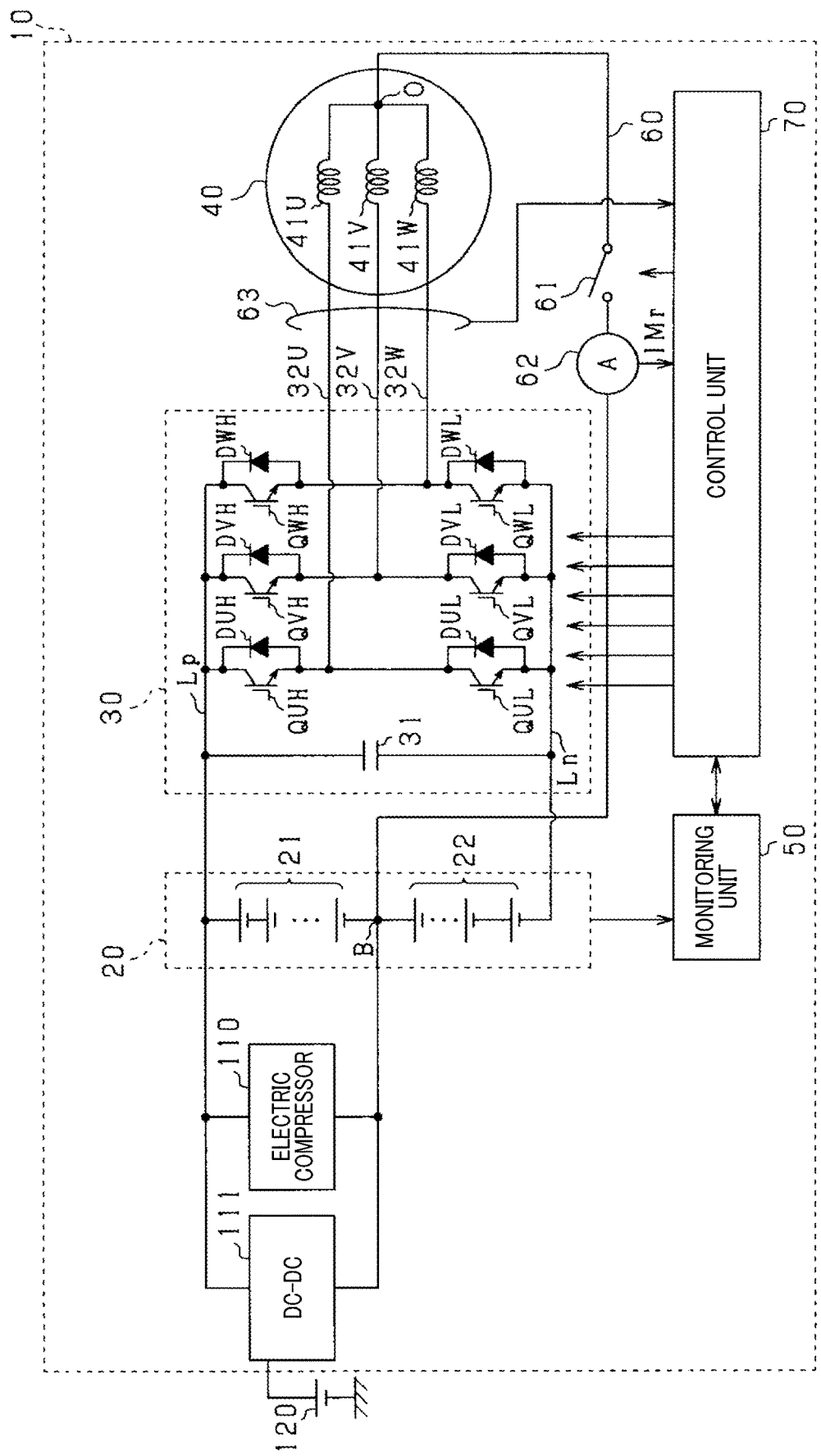
FIG. 13 is a schematic diagram of a power converter according to a fourth embodiment.

A fourth embodiment will now be described with reference to the accompanying drawings, focusing on differences from the second embodiment. In the present embodiment, as illustrated in FIG. 13, the first rechargeable battery 21 is connected in parallel with the electric compressor 110 and the DC-DC converter 111. For illustration purposes, in FIG. 13, the same structural elements as in FIG. 11 share the same reference numerals.

The present embodiment of the present disclosure can provide advantages similar to those of the second embodiment.

Fifth Embodiment

A fifth embodiment will now be described with reference to FIG. 14, focusing on differences from the first embodiment. For illustration purposes, in FIG. 14, the same structural elements as in FIG. 1 share the same reference numerals.

In the present embodiment, the rated voltage of each of the first and second rechargeable batteries 21 and 22 is 400 V. Therefore, the rated voltage of the assembled battery 20 is 800 V.

The second rechargeable battery 22 (corresponding to a "subject battery") is connectable to a first charger 121 provided outside the vehicle. The series connection of the first rechargeable battery 21 and the second rechargeable battery 22 is connectable to a second charger 122 outside the vehicle. The charging voltage of the second charger 122 is higher than that of the first charger 121. The first charger 121 supports fast charging, and the second charger 122 supports ultra-fast charging.

The intermediate terminal B is connectable to the positive side of the first charger 121 via the first switch SW1. The negative side of the second rechargeable battery 22 is connectable to the negative side of each of the first charger 121 and the second charger 122 via the switch SW2. The positive side of the first rechargeable battery 21 is connectable to the positive side of the second charger 122 via the third switch SW3. In the present embodiment, the first to third switches SW1 to SW3 are turned on or off by the control unit 70.

Figure 15:
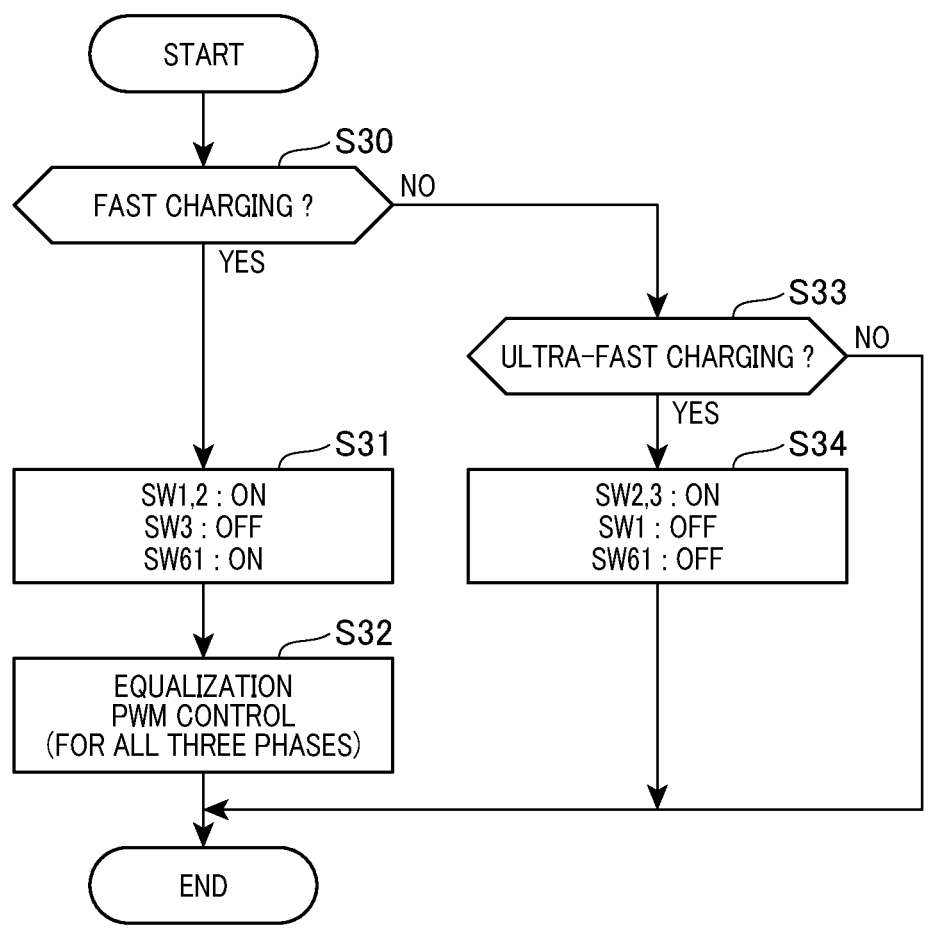
FIG. 15 is a flowchart of process steps performed by a control unit.

Process steps of the equalization control process according to the present embodiment will now be described with reference to FIG. 15. This process is repeatedly performed by the control unit 70, for example, every predefined control cycle.

At step S30, the control unit 70 determines whether there is a request for fast-charging of the second rechargeable battery 22 with the first charger 121.

If the answer is YES at step S30, the control unit 70 determines that there is the equalization request. Then, the process flow proceeds to step S31. At step S31, the control unit 70 turns on the first and second switches SW1 and SW2 and turns off the third switch SW3. The control unit 70 further turns on the connection switch 61.

Figure 16:
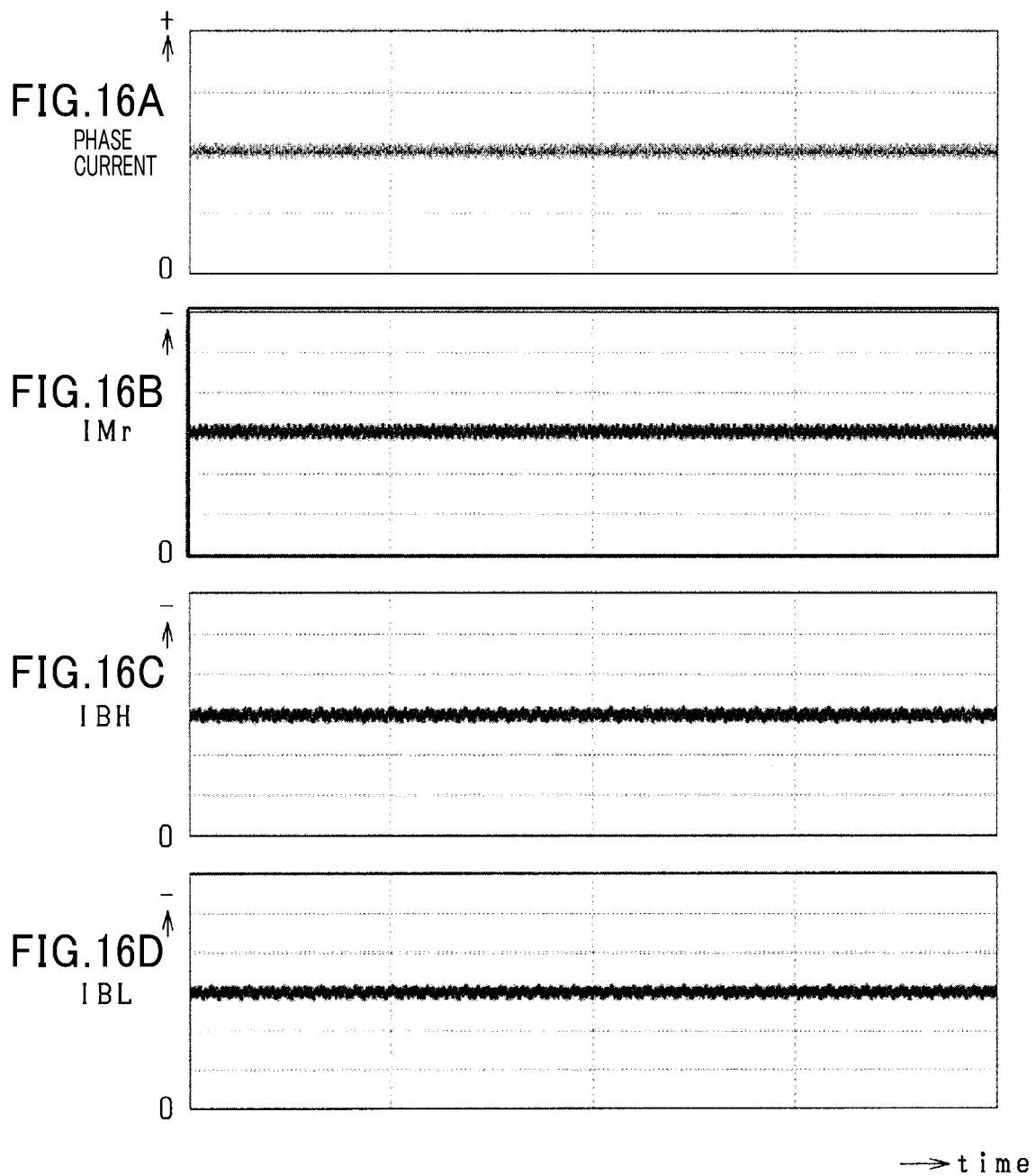
FIGS. 16A-16D are a timing chart illustrating a transition of each phase current or the like during charging from an external charger.

At step S32, the control unit 70 performs switching control of the U-, V-, and W-phase switches QUH to QWL to conduct current from the second rechargeable battery 22 to the first rechargeable battery 21 via the inverter 30 and the connection path 60. Even in the absence of the second charger 122, this allows the assembled battery 20 to be properly charged by the first charger 121 while equalizing the terminal voltages of the first rechargeable battery 21 and the second rechargeable battery 22. FIG. 16 illustrates a transition of each waveform during the process step S32. FIGS. 16A-16D respectively correspond to FIGS. 9A-9D described above.

If the answer is NO at step S30, the process flow proceeds to step S33. At step S33, the control unit 70 determines whether there is a request for ultra-fast charging of the assembled battery 20 with the second charger 122.

If the answer is YES at step S32, the process flow proceeds to step S34. At step S34, the control unit 70 turns on the second and third switches SW2 and SW3 and turns off the first switch SW1. The control unit 70 further turns on the connection switch 61. This allows the assembled battery 20 to be charged by the second charger 122.

If the answer is NO at step S33, the control unit 70 may turn off the first to third switches SW1 to SW3 and the connection switch 61.

According to the embodiment described above, in a system that supports ultra-rapid charging at 800 V, performing equalization control allows the assembled battery 20 to be fast-charged at 400 V.

In the present embodiment, for example, the second rechargeable battery 22 may be connected in parallel with the electric compressor 110 and the DC-DC converter 111. In this case, in a system that supports ultra-fast charging at 800 V, the high-voltage electrical load may be used. That is, in the system that supports ultra-fast charging at 800 V, the input voltage of the high-voltage electrical load can be halved.

Other Embodiments

The above embodiments may be modified and implemented as follows.

Figure 14:
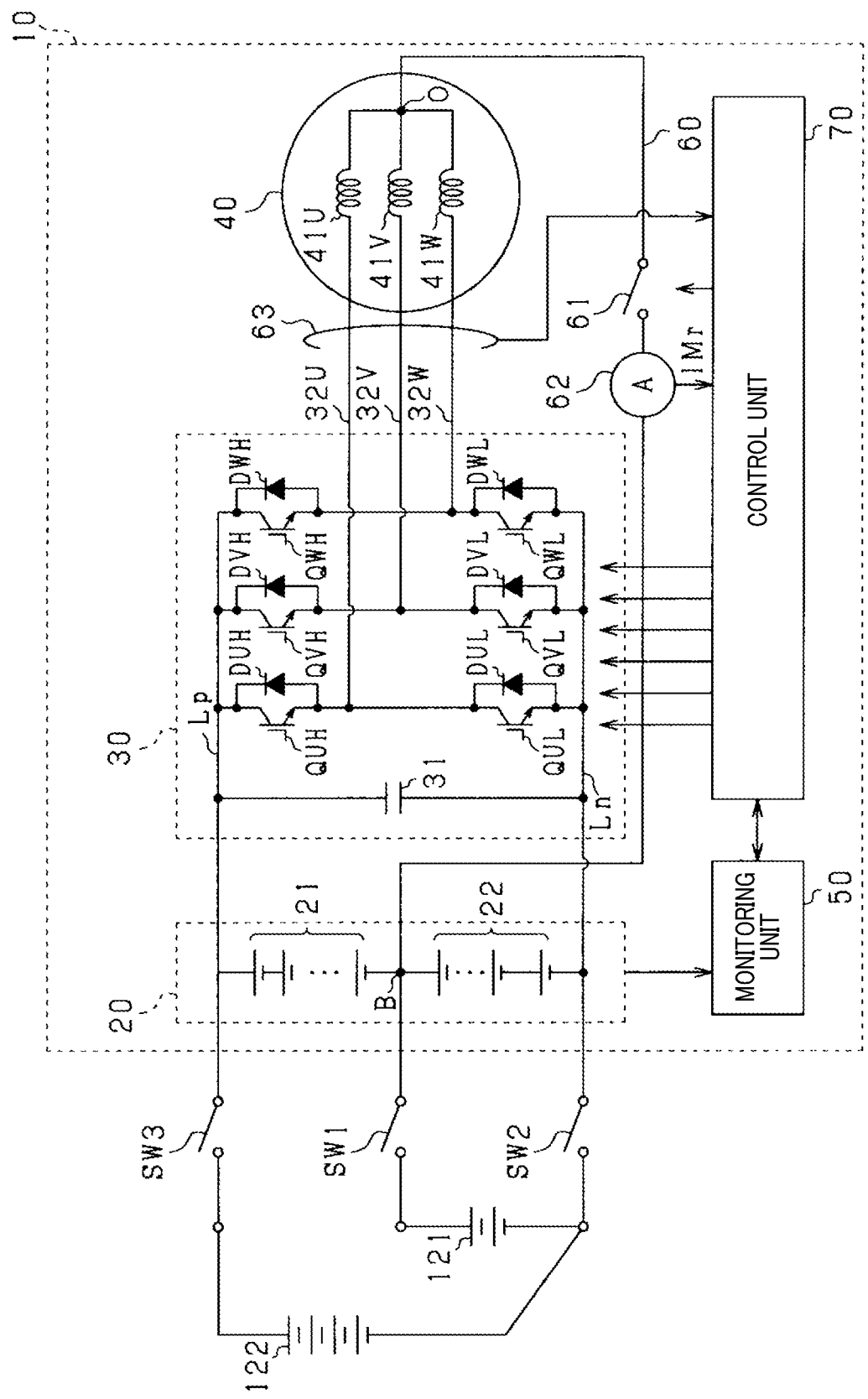
FIG. 14 is a schematic diagram of a power converter according to a fifth embodiment.

(1) In the configuration illustrated in FIG. 14 of the fifth embodiment, the first charger 121 may be used to charge not the second rechargeable battery 22 but the first rechargeable battery 21.

Figure 17:
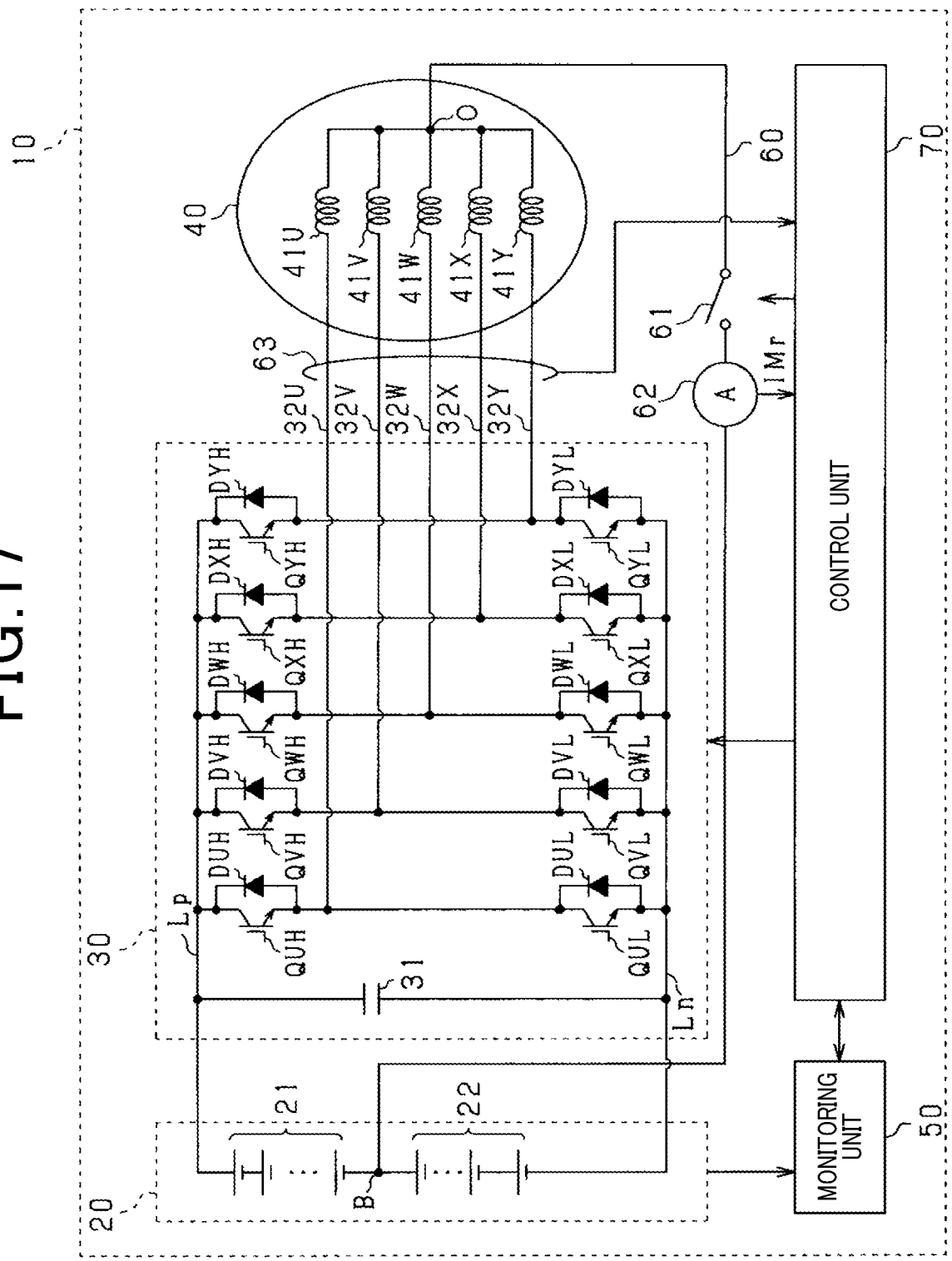
FIG. 17 is a schematic diagram of a power converter according to another embodiment.

(2) The rotating electrical machine and the inverter are not limited to three-phase rotating electrical machine and inverter, but may be, for example, five-phase or seven-phase rotating electrical machine and inverter. FIG. 17 illustrates a five-phase power converter. For illustration purposes, in FIG. 17, the same structural elements as in FIG. 1 share the same reference numerals.

In FIG. 17, the inverter 30 further includes X-phase upper and lower-arm switches QXH, QXL and diodes DXH, DXL, and Y-phase upper- and lower-arm switches QYH, QYL and diodes DYH, DYL. In addition, the rotating electrical machine 40 further includes an X-phase winding 41X and a Y-phase winding 41Y. The power converter 10 further includes an X-phase conductive member 32X and a Y-phase conductive member 32Y.

(3) The installation position of the current sensor that detects the current flowing through the neutral point O is not limited to the position illustrated in FIG. 1. For example, the current sensor may be provided along each of the conductive members 32U, 32V, 32W. In such a configuration, during equalization control, the neutral-point current IMr may be a sum of currents detected by the respective current sensors provided along the conductive members 32U, 32V, 32W.

(4) In equalization control, the control unit 70 may not synchronize switching control of the U-, V-, and W-phase upper-arm switches QUH, QVH, and QWH. In equalization control, the control unit 70 may not synchronize switching control of the U-, V-, and W-phase lower-arm switches QUL, QVL, and QWL.

(5) The connection switches 61 is not limited to a relay. As the connection switches 61, for example, a pair of N-channel MOSFETs with their sources electrically connected or IGBTs with their sources electrically connected may be used.

(6) The connection switch 61 is not indispensable. In a configuration where the connection switch 61 is absent, the intermediate terminal B and the neutral point O are always electrically connected.

(7) The upper and lower-arm switches that form the inverter are not limited to IGBTs, but may be N-channel MOSFETs.

(8) The first and second rechargeable batteries may not form an assembled battery.

(9) In each of the above embodiments, energy is transferred between the first rechargeable battery 21 and the second rechargeable battery 22 in order equalize the terminal voltages of the first and second rechargeable batteries 21 and 22. Alternatively, energy may be transferred between the first and second rechargeable batteries 21 and 22 regardless of whether to equalize the terminal voltages of the first and second rechargeable batteries 21 and 22.

In this case, for example, in a modification to the first embodiment, instead of making a determination as to whether there is a request for equalizing the terminal voltages of the first and second rechargeable batteries 21 and 22, a determination may be made as to whether there is a request for energy transfer from one of the first and second rechargeable batteries 21 and 22 to the other. In response to determining that there is a request for energy transfer, the command value setting unit 91 may calculate a target value of energy to be transferred from one of the first and second rechargeable batteries 21 and 22 to the other. Based on the calculated target value of energy, the command value setting unit 91 may set the neutral-point command current IM*. Specifically, for example, when transferring energy from the first rechargeable batteries 21 to the second rechargeable battery 22, the command value setting unit 91 may calculate a positive target value of energy such that the larger the positive target value of energy, the larger the neutral-point command current IM* is set. When transferring energy from the second rechargeable batteries 22 to the first rechargeable battery 21, the command value setting unit 91 may calculate a negative target value of energy such that the larger the absolute value of the negative target value of energy, the larger the absolute value of the neutral-point command current IM* is set.

(10) In the above-described embodiments and modifications, the control unit 70 and its method described in the present disclosure may be implemented by a dedicated computer including a processor and a memory programmed to execute one or more functions embodied by computer programs. Alternatively, the control unit 70 and its method described in the present disclosure may be implemented by a dedicated computer including a processor formed of one or more dedicated hardware logic circuits, or may be implemented by one or more dedicated computers including a combination of a processor and a memory programmed to execute one or more functions and a processor formed of one or more dedicated hardware logic circuits. The computer programs may be stored, as instructions to be executed by a computer, in a non-transitory, tangible computer-readable storage medium.

Although the present disclosure has been described with reference to the embodiments, it is understood that the present disclosure is not limited to the aforementioned embodiments and configurations. The present disclosure includes various variations and modifications within the equivalent range. In addition, various combinations and forms, as well as other combinations and forms further including only one element, or more or less than that, are within the scope and spirit of the present disclosure.

What is claimed is:

1. A power converter comprising:
   a rotating electric machine including windings, one for each phase;
   an inverter including a series connection of an upper arm switch and a lower-arm switch for each phase;
   a connection path electrically connecting a negative side of a first rechargeable battery, a positive side of a second rechargeable battery electrically connected in series with the first rechargeable battery, and a neutral point of the windings; and
   a control unit configured to perform switching control of the upper-arm switch and the lower-arm switch for each phase in order to transfer energy between the first and second rechargeable batteries by conducting current between the first and second rechargeable batteries via the inverter, the windings, and the connection path, the control unit being configured to determine whether there is a request for energy transfer between the first rechargeable battery and the second rechargeable battery,
   a positive terminal of a subject battery that is one of the first rechargeable battery and the second rechargeable battery is connectable to a positive side of a first external charger, and a negative terminal of the subject battery is connectable to a negative side of the first external charger,
   a positive terminal of the first rechargeable battery is connectable to a positive side of a second external charger, and a negative terminal of the second rechargeable battery is connectable to a negative side of the second external charger,
   a charging voltage of the second external charger is set higher than a charging voltage of the first external charger,
   the control unit is configured to, when the subject battery is being charged by the first external charger, determine that there is the request for energy transfer,
   the control unit is configured to, in response to determining that there is the request for energy transfer, perform switching control of the upper-arm switch and the lower-arm switch for each phase to conduct current from the subject battery to the other of the first rechargeable battery and the second rechargeable battery.

2. The power converter according to claim 1, further comprising an electric load connected in parallel with at least one of the first rechargeable battery and the second rechargeable battery.

3. The power converter according to claim 2, wherein the control unit is configured to, when the electric load is being driven, determine that there is the request for energy transfer.

4. The power converter according to claim 1, wherein the control unit is configured to, in response to determining that there is the request for energy transfer during driving of the rotating electric machine, perform switching control of the upper-arm switch and the lower-arm switch for each phase to transfer energy between the first rechargeable battery and the second rechargeable battery while driving the rotating electric machine.

5. The power converter according to claim 1, wherein the control unit is configured to synchronize switching control of the upper-arm switches for all phases and the lower-arm switches for all phases to transfer energy between the first rechargeable battery and the second rechargeable battery by conducting current between the first rechargeable battery and the second rechargeable battery via the inverter, the windings, and the connection path.

6. The power converter according to claim 1, wherein the control unit is configured to determine whether there is an equalization request for equalizing terminal voltages of the first rechargeable battery and the second rechargeable battery, and
the control unit is configured to, in response to determining that there is the equalization request, perform switching control of the upper-arm switch and the lower-arm switch for each phase to equalize the terminal voltages of the first rechargeable battery and the second rechargeable battery by conducting current between the first rechargeable battery and the second rechargeable battery via the inverter, the windings, and the connection path.

7. The power converter according to claim 1, wherein the control unit is configured to perform switching control of the upper-arm switch and the lower-arm switch for each phase such that direct current flows through the connection path, to transfer energy between the first rechargeable battery and the second rechargeable battery.

8. A power converter comprising:
   a rotating electric machine including windings, one for each phase;
   an inverter including a series connection of an upper arm switch and a lower-arm switch for each phase;
   a connection path electrically connecting a negative side of a first rechargeable battery, a positive side of a second rechargeable battery electrically connected in series with the first rechargeable battery, and a neutral point of the windings; and
   a control unit configured to perform switching control of the upper-arm switch and the lower-arm switch for each phase in order to transfer energy between the first and second rechargeable batteries by conducting current between the first and second rechargeable batteries via the inverter, the windings, and the connection path, the control unit being configured to determine whether there is a request for energy transfer between the first rechargeable battery and the second rechargeable battery;
   a connection switch provided along the connection path,
   wherein the control unit is configured to, in response to determining that there is the request for energy transfer, turn on the connection switch and perform switching control of the upper-arm switch and the lower-arm switch for each phase while keeping the connection switch on, to transfer energy between the first rechargeable battery and the second rechargeable battery by conducting current between the first rechargeable battery and the second rechargeable battery via the inverter, the windings, and the connection path, and the control unit is configured to, in response to determining that there is no request for energy transfer, turn off the connection switch.

9. The power converter according to claim 8, wherein a subject battery, which is one of the first rechargeable battery and the second rechargeable battery, is chargeable by a first external charger, a series connection of the first rechargeable battery and the second rechargeable battery is chargeable by a second external charger, and a charging voltage of the second external charger is set higher than a charging voltage of the first external charger.

10. The power converter according to claim 9, wherein the control unit is configured to, when the subject battery is being charged by the first external charger, determine that there is the request for energy transfer.

11. The power converter according to claim 8, further comprising an electric load connected in parallel with at least one of the first rechargeable battery and the second rechargeable battery.

12. The power converter according to claim 11, wherein the control unit is configured to, when the electric load is being driven, determine that there is the request for energy transfer.

13. The power converter according to claim 8, wherein the control unit is configured to, in response to determining that there is the request for energy transfer during driving of the rotating electric machine, perform switching control of the upper-arm switch and the lower-arm switch for each phase to transfer energy between the first rechargeable battery and the second rechargeable battery while driving the rotating electric machine.

14. The power converter according to claim 8, wherein the control unit is configured to synchronize switching control of the upper-arm switches for all phases and the lower-arm switches for all phases to transfer energy between the first rechargeable battery and the second rechargeable battery by conducting current between the first rechargeable battery and the second rechargeable battery via the inverter, the windings, and the connection path.

15. The power converter according to claim 8, wherein the control unit is configured to determine whether there is an equalization request for equalizing terminal voltages of the first rechargeable battery and the second rechargeable battery, and the control unit is configured to, in response to determining that there is the equalization request, perform switching control of the upper-arm switch and the lower-arm switch for each phase to equalize the terminal voltages of the first rechargeable battery and the second rechargeable battery by conducting current between the first rechargeable battery and the second rechargeable battery via the inverter, the windings, and the connection path.

16. The power converter according to claim 8, wherein the control unit is configured to perform switching control of the upper-arm switch and the lower-arm switch for each phase such that direct current flows through the connection path, to transfer energy between the first rechargeable battery and the second rechargeable battery.

* * * * *